US009831112B2

(12) United States Patent
Koiwa

(10) Patent No.: US 9,831,112 B2
(45) Date of Patent: Nov. 28, 2017

(54) SUBSTRATE PROCESSING APPARATUS AND SUBSTRATE DETACHING METHOD

(71) Applicant: Tokyo Electron Limited, Tokyo (JP)

(72) Inventor: Shingo Koiwa, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/534,246

(22) Filed: Nov. 6, 2014

(65) Prior Publication Data

US 2015/0132969 A1 May 14, 2015

(30) Foreign Application Priority Data

Nov. 13, 2013 (JP) ................................. 2013-234872

(51) Int. Cl.

| | |
|---|---|
| C23C 16/00 | (2006.01) |
| C23C 16/50 | (2006.01) |
| C23F 1/00 | (2006.01) |
| H01L 21/306 | (2006.01) |
| H01L 21/683 | (2006.01) |
| H01J 37/32 | (2006.01) |
| H01L 21/67 | (2006.01) |
| H01L 21/3065 | (2006.01) |

(52) U.S. Cl.
CPC .... *H01L 21/6833* (2013.01); *H01J 37/32697* (2013.01); *H01J 37/32706* (2013.01); *H01J 37/32724* (2013.01); *H01J 37/32834* (2013.01); *H01J 37/32844* (2013.01); *H01L 21/67109* (2013.01); *H01L 21/6831* (2013.01); *H01L 21/6838* (2013.01); *H01L 21/3065* (2013.01); *Y02C 20/30* (2013.01); *Y02P 70/605* (2015.11)

(58) Field of Classification Search
USPC ........ 118/715, 728–732; 156/345.51–345.55
See application file for complete search history.

(56) References Cited

U.S. PATENT DOCUMENTS

| 3,858,674 A * | 1/1975 | Tabor ....................... B60K 1/00 180/165 |
| 5,547,539 A * | 8/1996 | Arasawa ............. C23C 16/4586 156/345.26 |
| 2003/0063965 A1 * | 4/2003 | Langan ............. H01L 21/67724 414/217 |
| 2003/0097985 A1 * | 5/2003 | Kitazawa ............ C23C 16/4412 118/715 |

(Continued)

FOREIGN PATENT DOCUMENTS

JP 2013-149935 8/2013

*Primary Examiner* — Karla Moore
*Assistant Examiner* — Tiffany Nuckols
(74) *Attorney, Agent, or Firm* — IPUSA, PLLC

(57) ABSTRACT

A substrate processing apparatus includes an electrostatic chuck that includes a chuck electrode and electrostatically attracts a substrate; a direct voltage source that is connected to the chuck electrode and applies a voltage to the chuck electrode; and an evacuation unit that includes a rotor and discharges, via a heat transfer gas discharge pipe, a heat transfer gas supplied to a back surface of the substrate electrostatically-attracted by the electrostatic chuck. The evacuation unit is connected via a power supply line to the direct voltage source, generates regenerative power, and supplies the regenerative power to the direct voltage source.

9 Claims, 7 Drawing Sheets

(56) References Cited

U.S. PATENT DOCUMENTS

| | | | |
|---|---|---|---|
| 2007/0166134 A1* | 7/2007 | Suzuki | H01L 21/67109 414/217 |
| 2008/0277885 A1* | 11/2008 | Duff | B25B 11/005 279/3 |
| 2010/0247350 A1* | 9/2010 | Nagano | F04B 35/045 417/410.1 |
| 2011/0157761 A1* | 6/2011 | Tatsumi | H01L 21/6833 361/234 |

* cited by examiner

SUBSTRATE PROCESSING APPARATUS AND SUBSTRATE DETACHING METHOD

CROSS-REFERENCE TO RELATED APPLICATION

The present application is based upon and claims the benefit of priority of Japanese Patent Application No. 2013-234872, filed on Nov. 13, 2013, the entire contents of which are incorporated herein by reference.

BACKGROUND OF THE INVENTION

1. Field of the Invention

An aspect of this disclosure relates to a substrate processing apparatus and a substrate detaching method.

2. Description of the Related Art

Japanese Laid-Open Patent Publication No. 2013-149935, for example, discloses a substrate processing apparatus that includes an electrostatic chuck for electrostatically attracting a substrate and a heat transfer gas supply source for supplying a heat transfer gas to the back surface of the substrate, and a method for detaching the substrate from the electrostatic chuck.

The electrostatic chuck includes a chuck electrode. A voltage is applied from a direct voltage source to the chuck electrode to electrostatically attract the substrate to a mount table. The heat transfer gas is supplied to the back surface of the electrostatically-attracted substrate to make the temperature of the entire substrate uniform.

With the related-art technology, however, when the supply of power to the direct voltage source is stopped because of, for example, a blackout while the substrate is being detached from the mount table, the substrate may pop up from the electrostatic chuck and be damaged.

SUMMARY OF THE INVENTION

In an aspect of this disclosure, there is provided a substrate processing apparatus including an electrostatic chuck that includes a chuck electrode and electrostatically attracts a substrate; a direct voltage source that is connected to the chuck electrode and applies a voltage to the chuck electrode; and an evacuation unit that includes a rotor and discharges, via a heat transfer gas discharge pipe, a heat transfer gas supplied to a back surface of the substrate electrostatically-attracted by the electrostatic chuck. The evacuation unit is connected via a power supply line to the direct voltage source, generates regenerative power, and supplies the regenerative power to the direct voltage source.

DESCRIPTION OF THE PREFERRED EMBODIMENTS

Embodiments of the present invention are described below with reference to the accompanying drawings. In the specification and the drawings of the present application, the same reference numbers are assigned to substantially the same components, and repeated descriptions of those components are omitted.

<Overall Configuration of Substrate Processing Apparatus>

First, an exemplary overall configuration of a substrate processing apparatus 1 according to an embodiment of the present invention is described with reference to FIG. 1.

Figure 1:
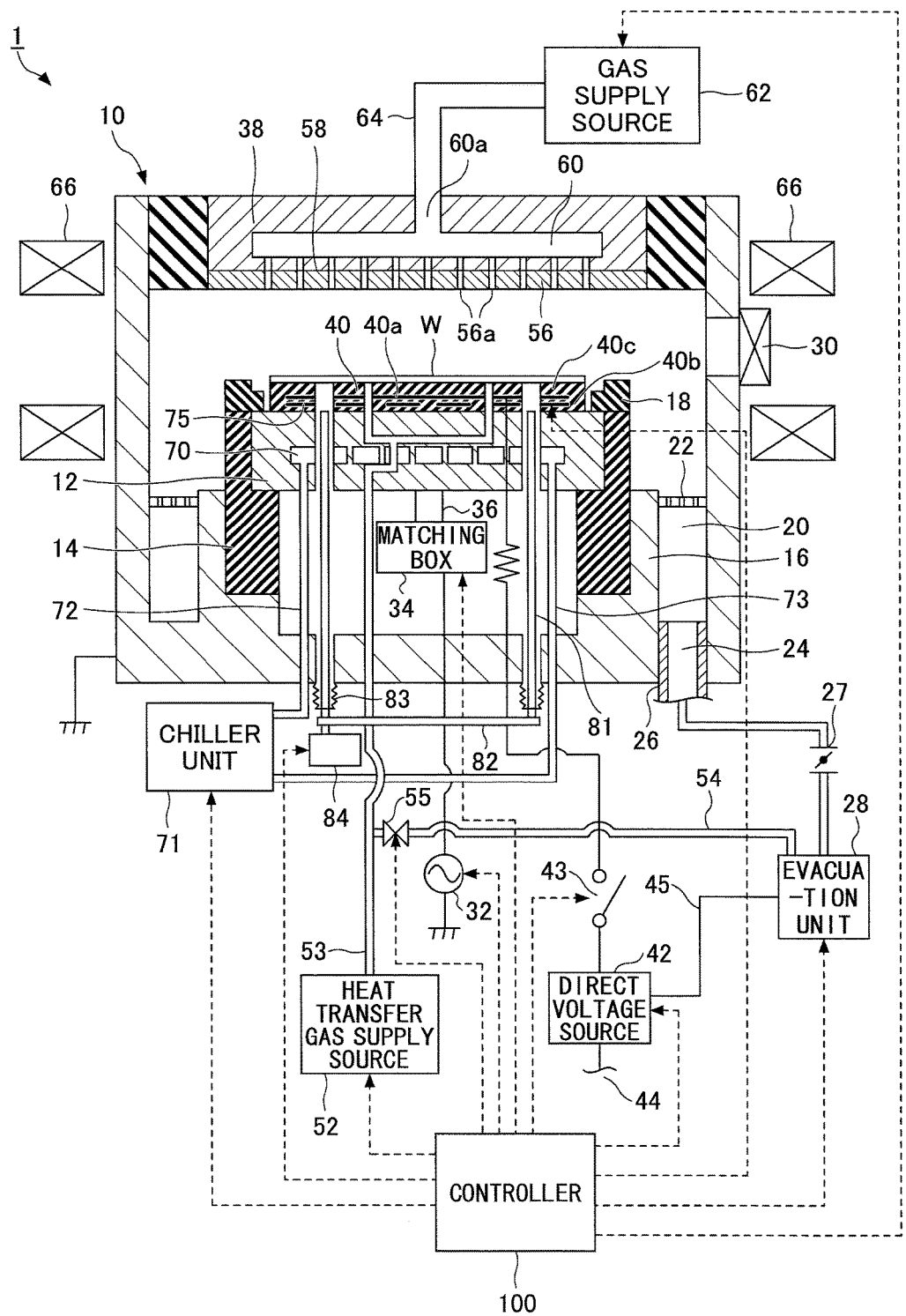
FIG. 1 is a drawing illustrating an exemplary configuration of a substrate processing apparatus.

The substrate processing apparatus 1 of FIG. 1 is a reactive-ion-etching (RIE) substrate processing apparatus. The substrate processing apparatus 1 includes a cylindrical process chamber 10 made of a metal material including, for example, aluminum or a stainless steel. The process chamber 10 is grounded. In the process chamber 10, plasma processing such as etching is performed on an object.

A mount table 12, on which a semiconductor wafer W (i.e., a substrate) is to be placed, is provided in the process chamber 10. The mount table 12 is composed of, for example, aluminum and supported via a cylindrical holder 14 having insulating properties by a cylindrical support 16 that extends vertically upward from the bottom of the process chamber 10. A focus ring 18, which is made of, for example, quartz, is provided on an upper surface of the cylindrical holder 14 such that the focus ring 18 circularly surrounds an upper surface of the mount table 12.

An evacuation channel 20 is formed between an inner wall of the process chamber 10 and an outer wall of the cylindrical support 16. A circular baffle board 22 is placed in the evacuation channel 20. An evacuation port 24 is formed at the bottom of the evacuation channel 20. An evacuation unit 28 including a rotor is connected via an evacuation pipe 26 to the evacuation port 24. The evacuation unit 28 decreases the pressure in the process chamber 10 to a predetermined vacuum pressure.

When the supply of power to the substrate processing apparatus 1 is stopped because of, for example, a blackout, the evacuation unit 28 converts rotational energy generated when the rotor is decelerated into regenerative power, and supplies the regenerative power to components of the substrate processing apparatus 1. The evacuation unit 28 may be implemented by or includes, for example, a turbo-molecular pump (TMP) that includes a rotor.

A pressure adjusting valve 27 is provided in the evacuation pipe 26 to maintain the pressure in the process chamber 10 being evacuated at a predetermined value.

A pressure adjusting unit 92 (see FIG. 4) obtains a pressure value monitored by a pressure sensor 91 (see FIG. 4) provided in the process chamber 10. Then, the pressure adjusting unit 92 automatically performs a calculation based on the obtained pressure value and controls the pressure adjusting valve 27 based on the calculation result to maintain the pressure in the process chamber 10 at a predetermined value.

The pressure adjusting valve 27 may be implemented by, for example, a gate valve or a butterfly valve. The pressure sensor 91 may be implemented by, for example, a capacitance manometer. The pressure adjusting unit 92 may be implemented by, for example, an auto pressure controller (APC).

A gate valve 30 is attached to a side wall of the process chamber 10. The gate valve 30 is opened and closed when the wafer W is carried into and out of the process chamber 10.

A high-frequency power source 32 for generating plasma is connected via a matching box 34 and a power supply rod 36 to the mount table 12. The high-frequency power source 32 supplies high-frequency power of, for example, 60 MHz to the mount table 12. Thus, the mount table 12 also functions as a lower electrode.

A shower head 38 is provided as the ceiling of the process chamber 10. The shower head 38 functions as an upper electrode that is at a ground potential. The high-frequency power for plasma generation is supplied from the high-frequency power source 32 to a "capacitor" formed between the mount table 12 and the shower head 38.

An electrostatic chuck 40 for holding the wafer W with electrostatic attraction is provided on an upper surface of the mount table 12. The electrostatic chuck 40 includes a sheet-shaped chuck electrode 40a made of a conductive film and a pair of dielectric layers 40b and 40c (dielectric parts) that sandwich the chuck electrode 40a.

A direct voltage source 42 is connected via a switch 43 to the chuck electrode 40a. When a voltage from the direct voltage source 42 is turned on, the electrostatic chuck 40 attracts and holds the wafer W with Coulomb force.

When the voltage to the chuck electrode 40a is turned off, the chuck electrode 40a is connected via the switch 43 to a ground 44. In the descriptions below, it is assumed that the chuck electrode 40a is grounded when the voltage to the chuck electrode 40a is turned off.

The direct voltage source 42 is also connected via a power supply line 45 to the evacuation unit 28. The regenerative power generated by the evacuation unit 28 is supplied to the direct voltage source 42.

A heat transfer gas supply source 52 supplies a heat transfer gas such as a He gas or an Ar gas via a gas supply line 53 to a back surface of the wafer W placed on the electrostatic chuck 40. The gas supply line 53 is connected via a heat transfer gas discharge pipe 54 to the evacuation unit 28. A gas discharge valve 55 is provided in the heat transfer gas discharge pipe 54. The evacuation unit 28 discharges the heat transfer gas, which has been supplied to the back surface of the wafer W, via the gas supply line 53 and the heat transfer gas discharge pipe 54.

The shower head 38 forming the ceiling of the process chamber 10 includes an electrode plate 56 having multiple gas holes 56a, and an electrode support 58 that detachably supports the electrode plate 56. A buffer chamber 60 is formed in the electrode support 58. A gas supply source 62 is connected via a gas supply pipe 64 to a gas port 60a of the buffer chamber 60. With the above configuration, a desired gas can be supplied through the shower head 38 into the process chamber 10.

Multiple (e.g., three) support pins 81 are provided in the mount table 12. The support pins 81 raise and lower the wafer W to pass and receive the wafer W to and from an external conveying arm (not shown). The support pins 81 may also be referred to as a "detaching part". The support pins 81 are caused to move up and down by a force of a motor 84 transmitted via a connecting part 82. Through holes are formed in the bottom of the process chamber 10, and the support pins 81 pass through the through holes to the outside of the process chamber 10. Bottom bellows 83 are provided below the through holes to keep the process chamber 10 airtight (i.e., to separate the vacuum space in the process chamber 10 from the outside space at an atmospheric pressure).

Circular or concentric magnets 66 are provided around the process chamber 10. The magnets 66 are arranged one over the other. In the process chamber 10, a plasma generating space is formed between the shower head 38 and the mount table 12. In the plasma generating space, a vertical RF electric field is formed by the high-frequency power source 32, and high-density plasma is generated near the surface of the mount table 12 by a high-frequency discharge.

A refrigerant pipe 70 is provided in the mount table 12. A refrigerant at a predetermined temperature is supplied from a chiller unit 71 and circulated through a pipe 72, the refrigerant pipe 70, and a pipe 73. A heater 75 is embedded in the electrostatic chuck 40. An alternating voltage is supplied from an alternator (not shown) to the heater 75.

With the chiller unit 71 for cooling and the heater 75 for heating, the processing temperature of the wafer W on the electrostatic chuck 40 is adjusted to a desired value.

A controller 100 controls components of the substrate processing apparatus 1 such as the gas supply source 62, the evacuation unit 28, the heater 75, the direct voltage source 42, the switch 43, the matching box 34, the high-frequency power source 32, the heat transfer gas supply source 52, the motor 84, the chiller unit 71, the pressure sensor 91, and the pressure adjusting unit 92. The controller 100 is also connected to a host computer (not shown).

The controller 100 includes a central processing unit (CPU), a read-only memory (ROM), and a random access memory (RAM) that are not shown. The CPU performs plasma processing according to various recipes stored in these storage areas (i.e., ROM and/or RAM). A recipe includes apparatus control information corresponding to process conditions. For example, the apparatus control information includes process time, temperatures in a process chamber (e.g., an upper electrode temperature, a temperature of a side wall of the process chamber, and an ESC temperature), a pressure (gas discharge), high-frequency power and voltage, process gas flow rates, and heat transfer gas flow rates.

To perform, for example, etching with the substrate processing apparatus 1 configured as described above, the gate valve 30 is opened, and then the wafer W held on a conveying arm is carried into the process chamber 10. Next, the wafer W is raised above the conveying arm by the support pins 81 protruding from the surface of the electrostatic chuck 40, and is held on the support pins 81. Then, after the conveying arm is moved out of the process chamber 10, the support pins 81 are lowered and retracted into the electrostatic chuck so that the wafer W is placed on the electrostatic chuck 40.

After the wafer W is carried into the process chamber 10, the gate valve 30 is closed, an etching gas is supplied from the gas supply source 62 into the process chamber 10 at a predetermined rate, and the pressure in the process chamber 10 is decreased by the evacuation unit 28 to a predetermined value. High-frequency power with a predetermined power level is supplied from the high-frequency power source 32 to the mount table 12.

Also, a voltage is applied from the direct voltage source 42 to the chuck electrode 40a of the electrostatic chuck 40 to electrostatically-attract and hold the wafer W on the electrostatic chuck 40. Further, a heat transfer gas is supplied to the back surface of the wafer W electrostatically-attracted to the electrostatic chuck 40.

The etching gas supplied from the gas supply source 62 is introduced via the shower head 38 into the process chamber 10 like a shower. Then, the etching gas is ionized by the high-frequency power supplied from the high-frequency power source 32 to generate plasma in the plasma generating space between the upper electrode (the shower head 38) and the lower electrode (mount table 12). The principal surface of the wafer W is etched by radicals and ions in the generated plasma.

After the plasma etching, the supply of the heat transfer gas is stopped, an inert gas is introduced into the process chamber 10, and the pressure in the process chamber 10 is maintained at a predetermined value using the pressure sensor 91 and the pressure adjusting unit 92. While the pressure in the process chamber 10 is maintained at the predetermined value, a voltage with opposite polarity, which is opposite to the polarity of the voltage applied to the chuck electrode 40a during the plasma etching, is applied to the chuck electrode 40a and then turned off to perform a dielectrification process for removing charges in the electrostatic chuck 40 and the wafer W.

Next, the support pins 81 are moved upward to raise the wafer W and thereby detach the wafer W from the electrostatic chuck 40. Then, the gate valve 30 is opened, the conveying arm is moved into the process chamber 10, and the support pins 81 are lowered so that the wafer W is held on the conveying arm. The conveying arm is moved out of the process chamber 10, and the next wafer W is carried into the process chamber 10 by the conveying arm. The above process is repeated to process multiple wafers W in succession.

An exemplary overall configuration of the substrate processing apparatus 1 of the present embodiment is described above. Next, exemplary substrate detaching methods performed by the substrate processing apparatus 1 when the supply of power is stopped because of, for example, a blackout are described with reference to FIGS. 2 through 6.

<Operations of Substrate Processing Apparatus>

First Embodiment

Figure 2:
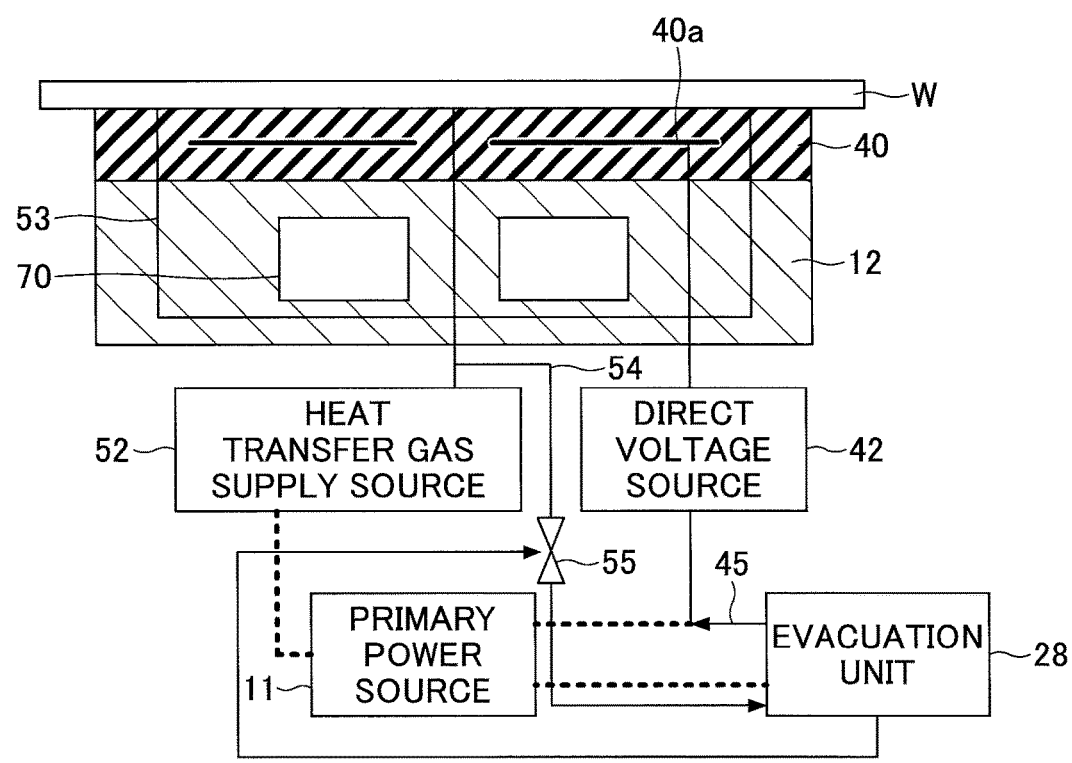
FIG. 2 is a schematic diagram of a part of a substrate processing apparatus according to a first embodiment.
Figure 3:
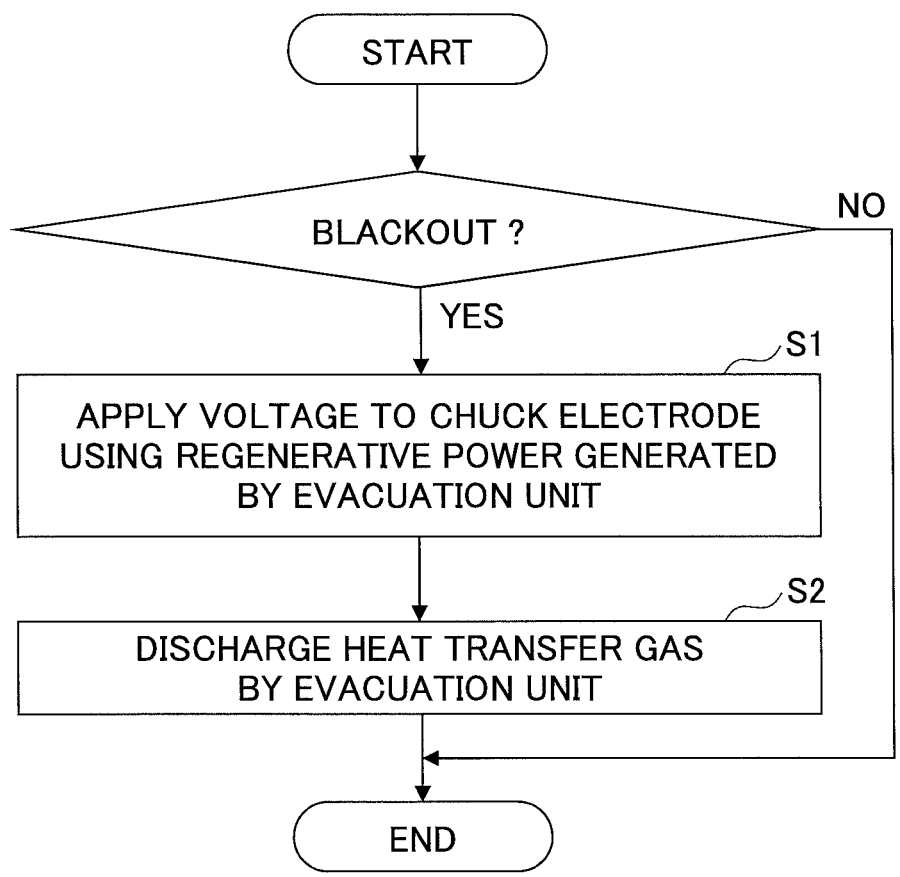
FIG. 3 is a flowchart illustrating a substrate detaching method according to the first embodiment.

FIG. 2 is a schematic diagram of a part of the substrate processing apparatus 1 according to a first embodiment. FIG. 3 is a flowchart illustrating a substrate detaching method according to the first embodiment.

As illustrated by FIG. 3, in the substrate detaching method of the first embodiment, a substrate (the wafer W) is detached from the electrostatic chuck that electrostatically attracts the substrate. The electrostatic chuck 40 includes the chuck electrode 40a and is provided in the process chamber 10 that can be evacuated by the evacuation unit 28. The substrate detaching method includes a step (S1) of applying a voltage to the chuck electrode 40a by supplying regenerative power generated by the evacuation unit 28 to the direct voltage source 42, and a step (S2) of discharging a heat transfer gas, which has been supplied to the back surface of an electrostatically-attracted substrate, via the heat transfer gas discharge pipe 54 by the evacuation unit 28.

Each of the steps is described below in more detail.

When the supply of power to the substrate processing apparatus 1 is stopped (i.e., when a primary power source 11 is turned off) because of, for example, a blackout, the heat transfer gas supply source 52 and the direct voltage source 42 being driven by power supplied from the primary power source 11 stop their operations. Also, the rotation of the rotor of the evacuation unit 28 decelerates, and the evacuation unit 28 stops.

[S1]
The evacuation unit 28 converts the rotational energy of the rotor generated during the deceleration into regenerative power, and supplies the regenerative power via the power supply line 45 to the direct voltage source 42. The direct voltage source 42 applies a voltage to the chuck electrode 40a using the regenerative power supplied from the evacuation unit 28.

As a result, the wafer W on the electrostatic chuck 40 continues to be attracted by the electrostatic chuck 40.

[S2]
Next, the evacuation unit 28 supplies the regenerative power to the gas discharge valve 55 provided in the heat transfer gas discharge pipe 54 to cause the gas discharge valve 55 to change from a closed state to an open state. As a result, the heat transfer gas, which has been supplied to the back surface of the electrostatically-attracted wafer W, is discharged by the evacuation unit 28 via the heat transfer gas discharge pipe 54.

In the exemplary process described above, the gas discharge valve 55 is opened to discharge the heat transfer gas by the evacuation unit 28. However, any other method or configuration may be used. For example, the gas discharge valve 55 may have a pressure adjusting function, and the gas discharge valve 55 may be adjusted so that the heat transfer gas is discharged by the evacuation unit 28.

Next, effects of the substrate detaching method of the first embodiment are described together with operations of the electrostatic chuck 40.

The electrostatic chuck 40 includes a sheet-shaped chuck electrode 40a made of a conductive film and a pair of dielectric parts that sandwich the chuck electrode 40a. During substrate processing, a substrate is attracted to the electrostatic chuck 40 by Coulomb force that is generated by applying a voltage from the direct voltage source 42 to the chuck electrode 40a. Also during the substrate processing, a heat transfer gas is supplied to the back surface of the electrostatically-attracted substrate to make the temperature of the entire substrate uniform.

After the substrate processing, the supply of the heat transfer gas is stopped, and after a predetermined period of time, the voltage applied to the chuck electrode 40a is turned off.

Here, when the supply of power to the direct voltage source 42 is stopped because of, for example, a blackout, the supply of the heat transfer gas is stopped and the voltage applied to the chuck electrode 40a is turned off at substantially the same time.

In this case, because the heat transfer gas remains in the gas supply line 53, the pressure of the heat transfer gas remaining under the back surface of the substrate becomes greater than the attraction of the electrostatic chuck 40. As a result, the substrate may pop up from the electrostatic chuck 40 and be damaged. In other words, the substrate may be caused to pop up from the electrostatic chuck 40 by the pressure of the heat transfer gas remaining under the back surface of the substrate, and the substrate may be damaged.

With the substrate detaching method of the first embodiment, when the supply of power to the direct voltage source 42 is stopped because of, for example, a blackout, regenerative power generated by the evacuation unit 28 is supplied to the direct voltage source 42, and therefore a voltage can be continuously applied to the chuck electrode 40a. This in turn makes it possible to maintain the attraction of the electrostatic chuck 40 greater than the pressure of the heat transfer gas remaining under the back surface of the substrate, and thereby makes it possible to prevent the substrate from popping up from the electrostatic chuck 40 due to the pressure of the heat transfer gas remaining under the back surface of the substrate.

Also with the substrate detaching method of the first embodiment, the heat transfer gas, which has been supplied to the back surface of the electrostatically-attracted substrate, is discharged via the heat transfer gas discharge pipe 54 by the evacuation unit 28. This makes it possible to forcibly reduce the pressure of the heat transfer gas remaining under the back surface of the substrate.

As described above, the substrate detaching method of the first embodiment makes it possible to prevent a substrate (wafer W) from popping up from the electrostatic chuck 40 and being damaged due to the pressure of a heat transfer gas remaining under the back surface of the substrate, even when the supply of power to the direct voltage source 42 is stopped because of, for example, a blackout.

Also with the configuration of the first embodiment, the rotational energy of the rotor of the evacuation unit 28, which is normally discharged as heat, is converted into regenerative power and reused. This configuration eliminates the need to use an external power supply such as an uninterruptible power supply (UPS) to supply power.

The substrate detaching method described above may be modified. For example, the order of steps S1 and S2 may be reversed.

In the above embodiment, the substrate detaching method of the first embodiment is performed when the supply of power from the primary power source 11 is stopped. However, the present invention is not limited to the above described embodiment.

For example, the controller 100 of the substrate processing apparatus 1 may be configured to be able to operate with the regenerative power supplied from the evacuation unit 28, and the substrate detaching method may be controlled by a signal from the controller 100.

Second Embodiment

Figure 4:
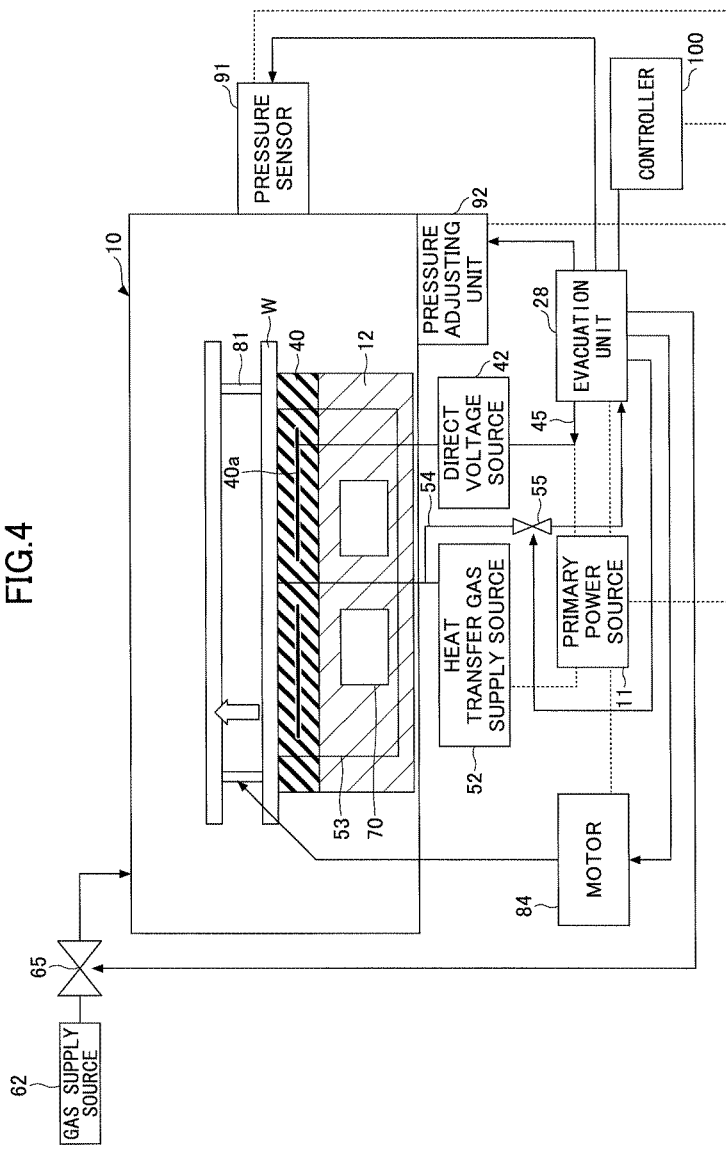
FIG. 4 is a schematic diagram of a part of a substrate processing apparatus according to a second embodiment.
Figure 5:
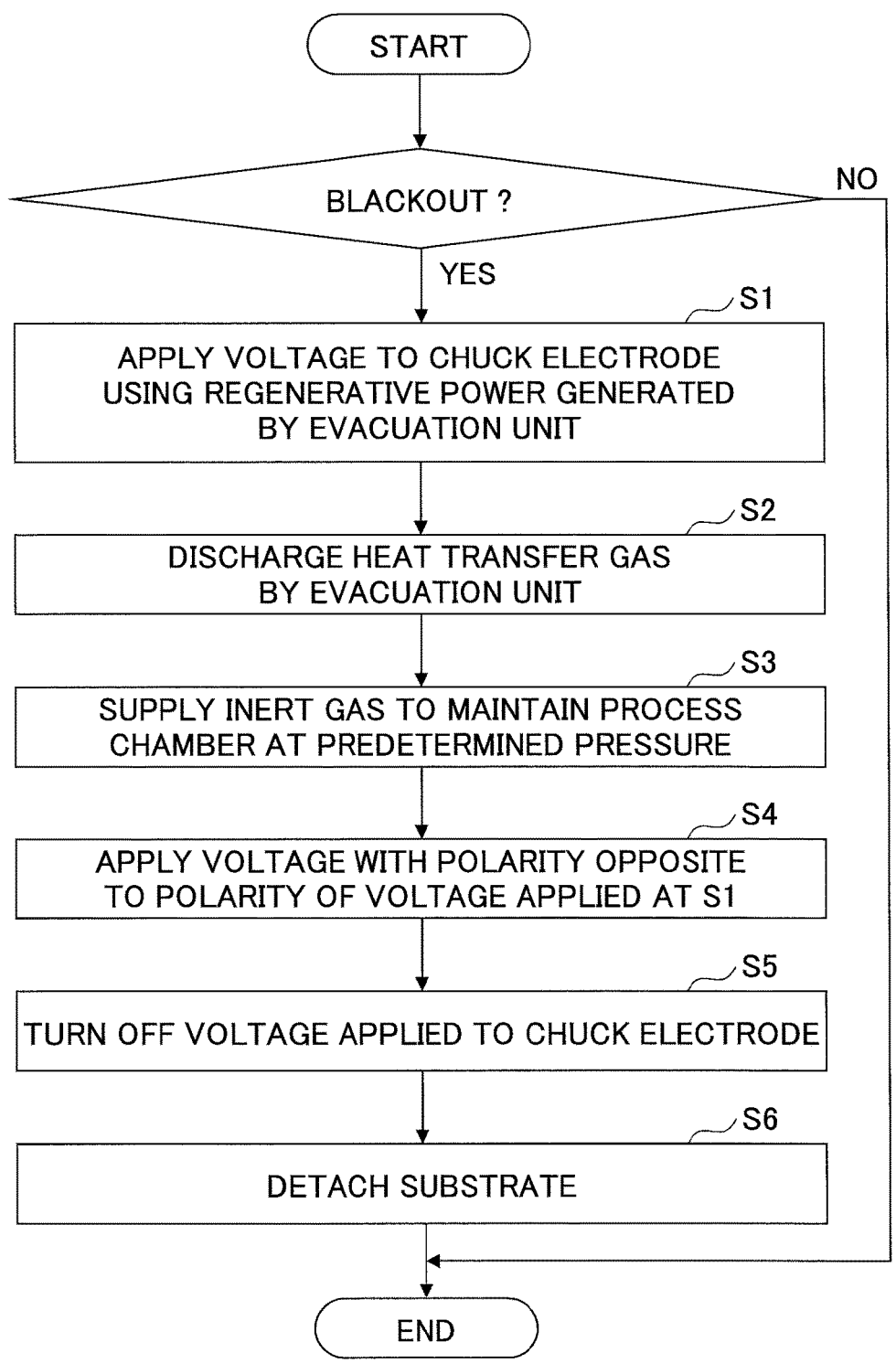
FIG. 5 is a flowchart illustrating a substrate detaching method according to the second embodiment.

FIG. 4 is a schematic diagram of a part of the substrate processing apparatus 1 according to a second embodiment. FIG. 5 is a flowchart illustrating a substrate detaching method according to the second embodiment.

As illustrated by FIG. 5, the substrate detaching method of the second embodiment includes, in addition to steps S1 and S2 described in the first embodiment, a step (S3) of maintaining the pressure in the process chamber 10 at a predetermined value by supplying an inert gas into the process chamber 10; a step (S4) of performing a diselectrification process on the substrate by applying a voltage with opposite polarity, which is opposite to the polarity of a voltage applied to the chuck electrode 40*a* at step S1, to the chuck electrode 40*a*; a step (S5) of turning off the voltage applied to the chuck electrode 40*a*; and a step (S6) of detaching the substrate from the electrostatic chuck 40 with the support pins 81.

Figure 6:
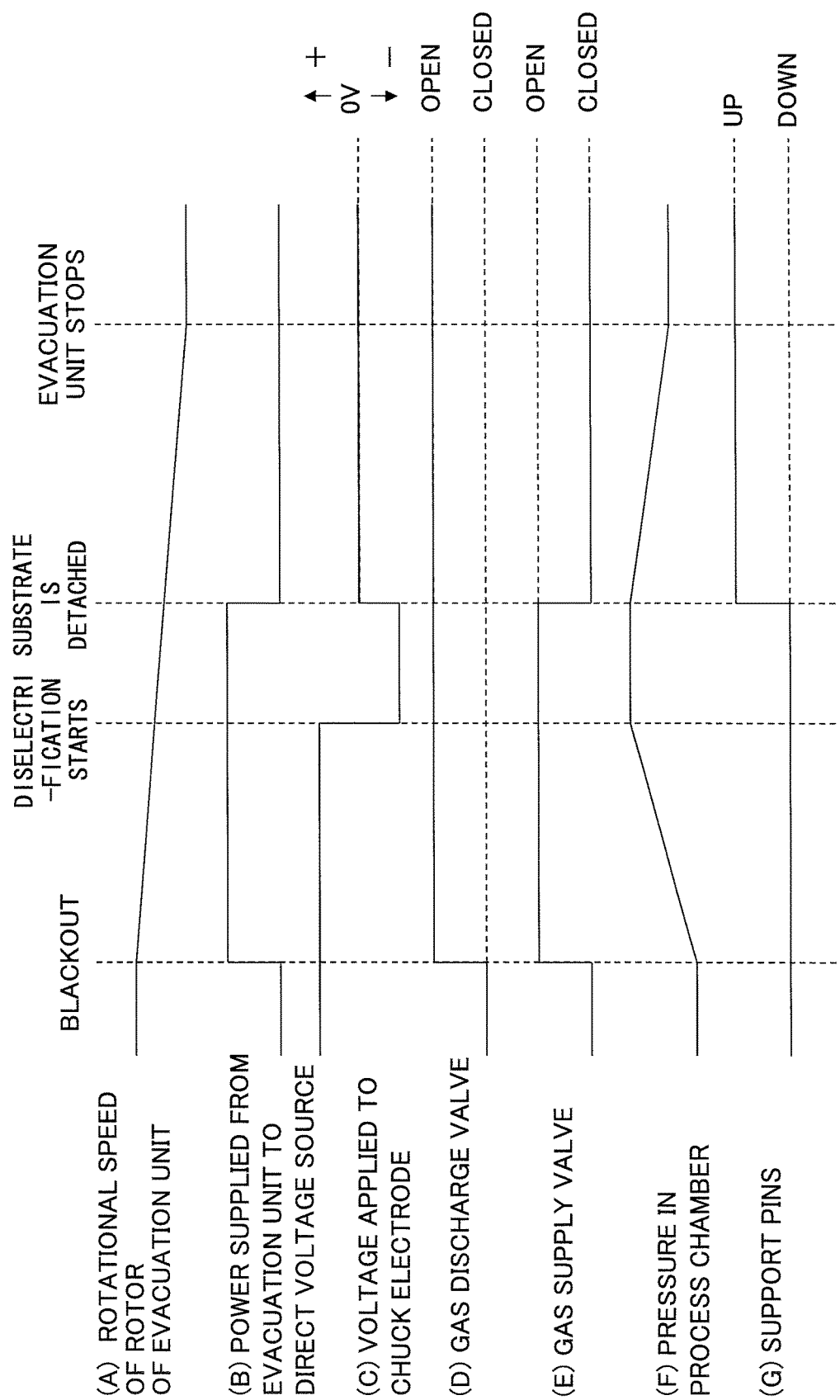
FIG. 6 is a timing chart illustrating timing of operations of a substrate processing apparatus according to the second embodiment.

FIG. 6 is a timing chart illustrating exemplary timing of operations of components of the substrate processing apparatus 1 of the second embodiment in a case where the supply of power to the substrate processing apparatus 1 is stopped (i.e., the primary power source 11 is turned off) because of, for example, a blackout.

In FIG. 6, (A) indicates a rotational speed of the rotor of the evacuation unit 28, (B) indicates power supplied from the evacuation unit 28 to the direct voltage source 42, (C) indicates a voltage applied to the chuck electrode 40*a*, (D) indicates a state (open or closed) of the gas discharge valve 55, (E) indicates a state (open or closed) of a gas supply valve 65, (F) indicates a pressure in the process chamber 10, and (G) indicates a state (up or down) of the support pins 81.

Respective steps are described below in more detail with reference to FIGS. 4 through 6.

Similarly to the first embodiment, when the supply of power to the substrate processing apparatus 1 is stopped (i.e., when the primary power source 11 is turned off) because of, for example, a blackout, the heat transfer gas supply source 52 and the direct voltage source 42 being driven by power supplied from the primary power source 11 stop their operations. Also, the rotation of the rotor of the evacuation unit 28 decelerates, and the evacuation unit 28 stops (FIG. 6 (A)).

[S1]

The evacuation unit 28 converts the rotational energy of the rotor generated during the deceleration into regenerative power, and supplies the regenerative power via the power supply line 45 to the direct voltage source 42 (FIG. 6 (B)). The direct voltage source 42 continues to apply a voltage to the chuck electrode 40*a* using the regenerative power supplied from the evacuation unit 28 (FIG. 6 (C)).

As a result, the wafer W on the electrostatic chuck 40 continues to be attracted by the electrostatic chuck 40.

[S2]

Next, the evacuation unit 28 supplies the regenerative power to the gas discharge valve 55 provided in the heat transfer gas discharge pipe 54 to open the gas discharge valve 55 (FIG. 6 (D)). As a result, the heat transfer gas, which has been supplied to the back surface of the electrostatically-attracted wafer W, is discharged by the evacuation unit 28 via the heat transfer gas discharge pipe 54.

In this exemplary process, the gas discharge valve 55 is opened so that the heat transfer gas is discharged by the evacuation unit 28. However, any other method or configuration may be used. For example, the gas discharge valve 55 may have a pressure adjusting function, and the gas discharge valve 55 may be adjusted so that the heat transfer gas is discharged by the evacuation unit 28.

[S3]

Next, the evacuation unit 28 supplies the regenerative power to the gas supply valve 65 to open the gas supply valve 65 (FIG. 6 (E)). The gas supply source 62 supplies an inert gas such as argon (Ar) or nitrogen ($N_2$) into the process chamber 10 via the gas supply pipe 64 where the gas supply valve 65 is provided.

Also, the evacuation unit 28 supplies the regenerative power to the pressure sensor 91 and the pressure adjusting unit 92. The pressure adjusting unit obtains a pressure value monitored by the pressure sensor 91 provided in the process chamber 10. Then, the pressure adjusting unit 92 automatically performs a calculation based on the obtained pressure value and controls the pressure adjusting valve 27 based on the calculation result to maintain the pressure in the process chamber 10 at a predetermined value (FIG. 6 (F)).

The pressure in the process chamber 10 is preferably between 100 mTorr and 400 mTorr, and more preferably between 200 mTorr and 300 mTorr. Setting the pressure in the process chamber 10 within these ranges improves the effect of a diselectrification process performed at step S4 described below.

[S4]

Next, the evacuation unit 28 supplies the regenerative power to the controller 100. After the pressure in the process chamber 10 is adjusted to the predetermined value, the controller 100 controls the direct voltage source 42 to apply a voltage with opposite polarity, which is opposite to the polarity of the voltage applied to the chuck electrode 40*a* at step S1, to the chuck electrode 40*a* (FIG. 6 (C)). As a result, charges accumulated in the electrostatic chuck 40 and the wafer W are removed, and it becomes easier to detach the wafer W from the electrostatic chuck 40.

[S5]

Next, the controller 100 turns off the switch 43 to turn off the voltage being applied to the chuck electrode 40*a* (FIG. 6 (C)).

[S6]

Next, the evacuation unit 28 supplies the regenerative power to the motor 84. The controller 100 drives the motor 84 to cause the support pins 81 to move upward (FIG. 6 (G)). As a result, the wafer W is raised and detached from the electrostatic chuck 40.

As described above, the substrate detaching method of the second embodiment makes it possible to prevent a substrate (wafer W) from popping up from the electrostatic chuck 40 and being damaged due to the pressure of a heat transfer gas remaining under the back surface of the substrate, even when the supply of power to the direct voltage source 42 is stopped because of, for example, a blackout. Also with the configuration of the second embodiment, the rotational energy of the rotor of the evacuation unit 28, which is normally discharged as heat, is converted into regenerative power and reused. This configuration eliminates the need to use an external power supply such as a UPS to supply power.

Further, according to the substrate detaching method of the second embodiment, a substrate dielectrification process and a substrate detaching process are also performed automatically. This in turn makes it possible to simplify manual operations that are necessary to restore the substrate processing apparatus 1.

The substrate detaching method described above may be modified. For example, the order of steps S1 and S2 may be reversed.

Third Embodiment

Figure 7:
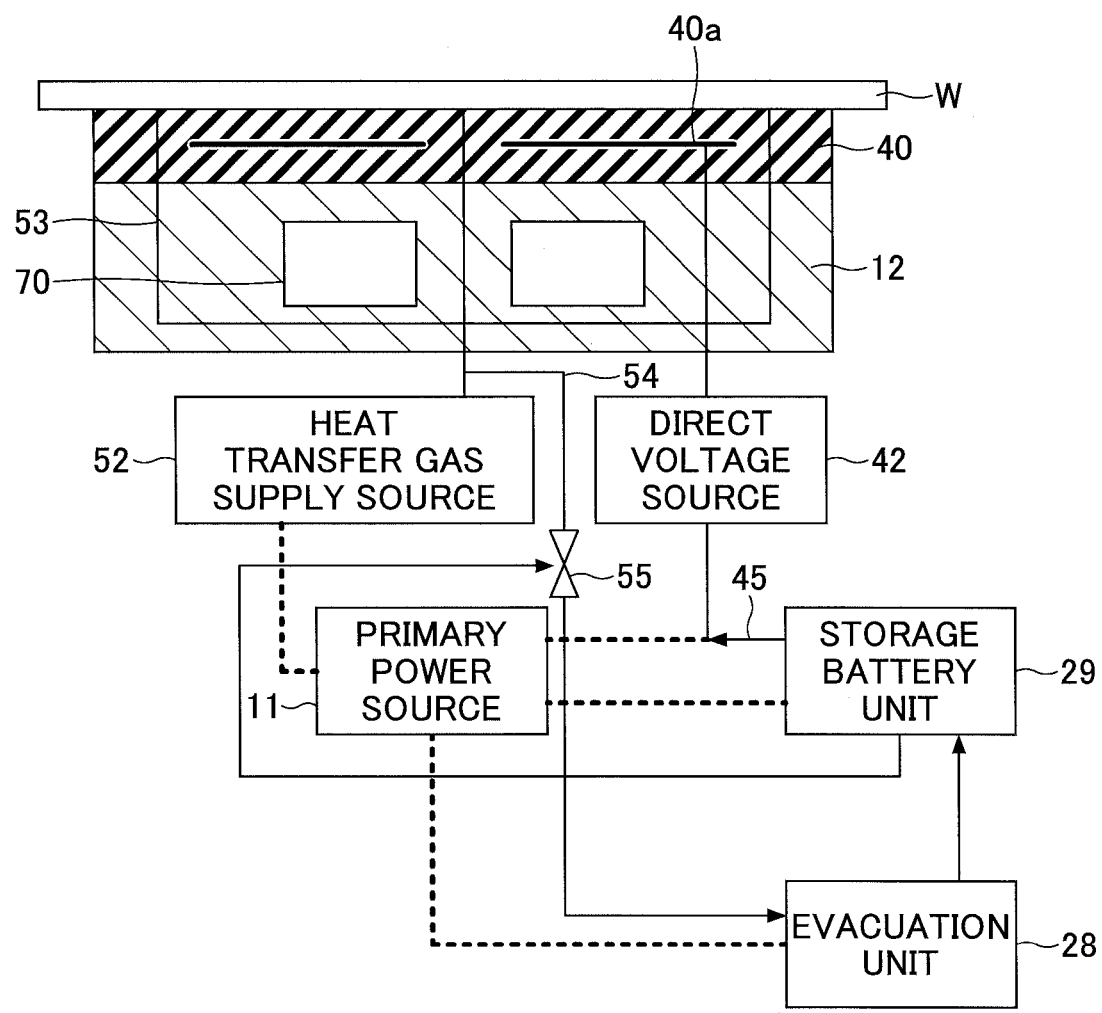
FIG. 7 is a schematic diagram of a part of a substrate processing apparatus according to a third embodiment.

FIG. 7 is a schematic diagram of a part of the substrate processing apparatus 1 according to a third embodiment.

As illustrated by FIG. 7, the substrate processing apparatus 1 of the third embodiment includes a storage battery unit 29 in addition to the components of the substrate processing apparatus 1 described in the first embodiment.

The storage battery unit 29 is connected to the primary power source 11, the evacuation unit 28, and the direct voltage source 42. The storage battery unit 29 stores power supplied from the primary power source and discharges electricity as necessary to supply power to the direct voltage source 42.

When the supply of power to the substrate processing apparatus 1 is stopped (i.e., when the primary power source 11 is turned off) because of, for example, a blackout, regenerative power generated by the evacuation unit 28 is supplied via the storage battery unit 29 to the direct voltage source 42.

The storage battery unit 29 may be implemented, for example, by a UPS including a lithium-ion battery, a lead-acid battery, a sodium-sulfur (NaS) battery, or a nickel-hydrogen battery.

The substrate detaching method of the third embodiment is similar to the substrate detaching method of the first embodiment except that regenerative power generated by the evacuation unit 28 and power stored in the storage battery unit 29 are supplied to the direct voltage source 42 when the supply of power to the substrate processing apparatus 1 is stopped (i.e., when the primary power source 11 is turned off) because of, for example, a blackout. Therefore, descriptions of steps of the substrate detaching method of the third embodiment are omitted here.

Similarly to the first and second embodiments, the substrate detaching method of the third embodiment makes it possible to prevent a substrate (wafer W) from popping up from the electrostatic chuck 40 and being damaged due to the pressure of a heat transfer gas remaining under the back surface of the substrate, even when the supply of power to the direct voltage source 42 is stopped because of, for example, a blackout.

The substrate detaching method of the third embodiment also makes it possible to stably store power supplied from the primary power source 11 in the storage battery unit 29. This in turn makes it possible to supply power stored in the storage battery unit 29 in addition to regenerative power generated by the evacuation unit 28 when the supply of power to the substrate processing apparatus 1 is stopped (i.e., when the primary power source 11 is turned off) because of, for example, a blackout. Thus, the substrate detaching method of the third embodiment makes it possible to supply power for a longer period of time.

In the third embodiment, the storage battery unit 29 is provided separately from the evacuation unit 28. Alternatively, the storage battery unit 29 may be incorporated in the evacuation unit 28.

A substrate processing apparatus and a substrate detaching method according to the embodiments are described above. However, the present invention is not limited to the specifically disclosed embodiment, and variations and modifications may be made without departing from the scope of the present invention.

For example, the substrate processing apparatus 1 is not limited to a capacitively-coupled plasma processing apparatus as described above, and may be implemented as any type of apparatus such as a vacuum evaporation apparatus, a sputtering apparatus, or a chemical vapor deposition (CVD) apparatus that includes an evacuation unit including a rotor.

Also, a substrate to be processed according to the present invention is not limited to a semiconductor wafer. For example, a substrate to be processed may be a large-size substrate for a flat panel display (FPD), an EL element, or a substrate for a solar battery.

An aspect of this disclosure provides a substrate processing apparatus and a substrate detaching method that can prevent a substrate from being damaged.

What is claimed is:

1. A substrate processing apparatus, comprising:
   an electrostatic chuck that includes a chuck electrode and electrostatically attracts a substrate;
   an evacuation unit that includes a rotor and discharges, via a heat transfer gas discharge pipe, a heat transfer gas supplied to a back surface of the substrate electrostatically-attracted by the electrostatic chuck, and
   a direct voltage source that is connected to the chuck electrode and the evacuation unit and applies a voltage to the chuck electrode and the evacuation unit;
   wherein the evacuation unit is connected via a power supply line to the direct voltage source,
   wherein the rotor is configured to convert rotational energy into regenerative power,
   wherein the evacuation unit supplies the regenerative power to the electrostatic chuck and the evacuation unit through the direct voltage source when supply of power to the direct voltage source is stopped, and wherein the substrate processing apparatus further comprises a processor that is configured to control the evacuation unit to supply the regenerative power to the electrostatic chuck and the evacuation unit through the direct voltage source when a power supply to the direct voltage source is unintentionally stopped.

2. The substrate processing apparatus as claimed in claim 1, wherein the evacuation unit generates the regenerative power and supplies the regenerative power to the direct voltage source when the supply of power to the direct voltage source is stopped.

3. The substrate processing apparatus as claimed in claim 1, further comprising:

a storage battery unit, wherein the evacuation unit generates the regenerative power and supplies the regenerative power via the storage battery unit to the direct voltage source when supply of power to the direct voltage source is stopped.

4. The substrate processing apparatus as claimed in claim 1, further comprising:

a gas discharge valve provided in the heat transfer gas discharge pipe, wherein the evacuation unit discharges the heat transfer gas by adjusting the gas discharge valve.

5. The substrate processing apparatus as claimed in claim 1, wherein the evacuation unit includes a turbo-molecular pump.

6. The substrate processing apparatus as claimed in claim 1, wherein the evacuation unit supplies the regenerative power to both the electronic chuck and a evacuation valve of the evacuation unit through the direct voltage source.

7. The substrate processing apparatus as claimed in claim 1, wherein the evacuation unit supplies the regenerative power to both the electronic chuck and a controller for controlling the electronic chuck through the direct voltage source.

8. The substrate processing apparatus as claimed in claim 1, wherein the evacuation unit supplies the regenerative power to the evacuation unit after the evacuation unit supplies the regenerative power to the direct voltage source.

9. The substrate processing apparatus as claimed in claim 1, wherein an attraction force of the electrostatic chuck is greater than a pressure of the heat transfer gas remaining under the back surface of the substrate when the evacuation unit supplies the regenerative power to the direct voltage source.

* * * * *